United States Patent [19]
Kurisu

[11] Patent Number: 5,628,059
[45] Date of Patent: May 6, 1997

[54] DC OFFSET CIRCUIT FOR CARTESIAN LOOP

[75] Inventor: Yoshikazu Kurisu, Ichikawa, Japan

[73] Assignee: Uniden Corporation, Chiba, Japan

[21] Appl. No.: 352,655

[22] Filed: Dec. 9, 1994

[30] Foreign Application Priority Data

Jul. 15, 1994 [JP] Japan .................................. 6-164425

[51] Int. Cl.$^6$ .................................................. H04B 1/04
[52] U.S. Cl. ........................ 455/126; 455/115; 375/216; 375/284
[58] Field of Search ................... 455/38.1, 115, 455/126, 127; 375/216, 281, 284, 285, 308, 318, 319

[56] References Cited

U.S. PATENT DOCUMENTS

| | | | |
|---|---|---|---|
| 5,212,814 | 5/1993 | Iwane | 455/126 |
| 5,371,481 | 12/1994 | Tittanen | 455/126 |
| 5,381,108 | 1/1995 | Whitmarsh | 455/115 |
| 5,396,196 | 3/1995 | Blodgett | 375/284 |
| 5,469,105 | 11/1995 | Sparks | 455/126 |
| 5,483,681 | 1/1996 | Bergsten | 455/126 |

FOREIGN PATENT DOCUMENTS 1-208918  8/1989  Japan.
3-190436  8/1991  Japan.

*Primary Examiner*—Leslie Pascal
*Attorney, Agent, or Firm*—Lowe, Price, LeBlanc & Becker

[57] ABSTRACT

In a DC offset circuit for a Cartesian loop, a DSP supplies step by step a slope voltage from a minimum DC output voltage, up to a maximum DC output voltage, to input sections of operational amplifiers for modulation. This arises each time transmission is started in a state where a signal Q' and a signal I', each based on only a carrier wave, are outputted from a quadrature demodulator. When comparators detect that output from operational amplifiers is 0 V, the DSP decides a value of the slope voltage then as a DC offset voltage value. Operation is started centering on this DC offset voltage value.

8 Claims, 4 Drawing Sheets

5,628,059

DC OFFSET CIRCUIT FOR CARTESIAN LOOP

This application relates to Disclosure Document No. 357226 filed Jul. 7, 1994 under the U.S. Patent and Trademark Office Disclosure Document Program.

FIELD OF THE INVENTION

The present invention relates to a DC offset circuit in a tone-in-band transmitter based on a direct modulation system and having a distortion reducing circuit.

BACKGROUND OF THE INVENTION

As a conventional type of tone-in-band transmitter with a distortion reducing circuit based on a direct modulation system, there is, for instance, one in which a modulated wave amplified by a power amplifier is inputted via a directional coupler and an attenuator into a quadrature demodulator, a signal demodulated in the quadrature demodulator is outputted to an amplifier, subtraction (NFB) with a signal to drive the quadrature modulator is executed in an input section of the amplifier, and output from the amplifier is inputted into the quadrature modulator to generate a modulated wave.

FIG. 4 is a block diagram of a main section of a conventional type of tone-in-band transmitter with a distortion reducing circuit based on a direct modulation system. An aural signal introduced from a microphone 401 is amplified by an microphone amplifier 402, subjected to A/D conversion in an A/D convertor 403, and fetched into a DSP (sound processing circuit for modulation) 404.

In the DSP 404, the inputted aural signal is subjected to such a processing required for generation of tone-in-band as band limitation, band division, and frequency shift, and the signal is outputted after being divided to two signals I, Q crossing each other at right angles. The two signals I, Q are subjected to D/A conversion in a D/A convertor 405 and sent to operational amplifiers 406, 407, each for modulation, and each provided in correspondence to the signals I, Q respectively. It should be noted that signals I', Q', demodulated by a quadrature demodulator 415 and amplified in amplifiers 418, 419 or in amplifiers 420, 421 are inputted into input sections of the operational amplifiers 406, 407, each for modulation, respectively, and subtraction (NFB) between the signals I, Q and signals I', Q' is executed.

Then by driving the quadrature modulator 408 with modulated output from the operational amplifiers 406, 407, each for modulation, a modulated wave (tone-in-band) is outputted from the quadrature modulator 408. It should be noted that a signal from a local oscillator 416 is distributed by a power splitter 417 into the quadrature modulator 408. The modulated wave outputted from the quadrature modulator 408 is amplified in a pre-amplifier 409 and an RF power amplifier 410 and then transmitted from an antenna 411. Also, only a progressive wave is detected by a directional coupler 412 from sending power amplified by the RF power amplifier 410, and the progressive wave passes through an attenuator 413 and a phase line 414 each for level adjustment and is sent to a quadrature demodulator 415. It should be noted that a signal (carrier wave) from a local oscillator 416 is distributed by a power splitter 417 to the quadrature demodulator 415 as in the case of the quadrature modulator 408.

In the quadrature demodulator 415, the quadrature relationship between signals is important, and the directional coupler 412 described above is employed to prevent effects by a reflected wave, and also the phase line 414 is provided to accurately align the phase.

Thus in the output from the quadrature demodulator appear the demodulated signals I', Q'. And the signals I', Q' are amplified by the amplifiers 418, 419 or the amplifiers 420, 421 in the next stage respectively and subjected to subtraction in input sections of the operational amplifiers 406, 407 each for modulation, and thus the distortion reducing circuit being operated.

The tone-in-band has tone inserted at a center of the band, but this is a reduced carrier, which is generally adjusted to an output level of the maximum modulation level of around −10 dB. The reduced wave is at first reduced to around −30 dB or below for balance with the quadrature modulator 408, and a level of the carrier is controlled according to DC voltage outputted being superimposed on aural signals of the signals I, Q outputted from the DSP 404.

However in a circuit of the conventional type of tone-in-band transmitter with a distortion reducing circuit based on a direct modulation system, as a balance with the quadrature demodulator 415 is not established only by turning power ON, reduction of a carrier wave may be inappropriate, or because of that the operational amplifier for modulation 406 or 407 may be saturated and disabled, and the operational amplifier 406 or 407 would not run normally.

For this reason, in order to overcome this problem, in a state where functions of the pre-amplifier 409 and the RF power amplifier 410 are stopped with carrier wave inputted only into the quadrature demodulator 415, and DC elements due to imbalance in the quadrature modulator 415 are being outputted as signals I', Q', signals I, Q are sent from the DSP 404, subtraction between the signals I, Q and signals I', Q' is executed in input sections of the operational amplifiers modulations 406, 407, each for modulation. Furthermore, the value of voltage amplified in and outputted from the operational amplifiers 406, 407, each for modulation, is measured, DC voltage values of the signals I, Q at a point of time when the measured value above is 0 V are obtained as DC offset values for the operational amplifiers 406, 407, each for modulation, the DC offset voltage values are stored previously as estimated values in the DSP 404, and operation is started each time operation of the DSP 404 is started according to the estimated values.

Namely, DC voltage values which can be balanced with the quadrature demodulator 415 (DC offset values) are stored as estimated values in the DSP 404 by making use of the phenomenon that the output from the operational amplifiers 406, 407 become 0 instantly when the signals I, Q outputted from the DSP 404 cancel the signals I', Q' due to imbalance in the quadrature demodulator 415, and balance in the quadrature demodulator 415 are always maintained by using the estimated values.

It should be noted that, as this circuit is an NFB circuit, an imbalance element generated in the quadrature modulator 408 appears in the signals I', Q' from the quadrature demodulator 415, and are amplified by the amplifiers 418, 419 or amplifiers 420, 421 and then returned, automatic adjustment being thereby executed.

However, with the conventional technology as described above, although imbalance in a demodulation circuit or in a modulation circuit (quadrature demodulator, quadrature modulator) is eliminated by making use of the estimated values obtained through previous measurement and stored therein, balance in an operational amplifier for modulation and that in a demodulation circuit, a modulation circuit (quadrature demodulator, quadrature modulator) drifts due to such a reason as change in temperature or fluctuation of power. Hence, dispersion is very large, and balance can not appropriately be established only by using the same estimated values each time.

Also, measurement of the estimated value above is not executed for each transmitter, and a DC offset voltage value is measured for a plurality of transmitters each based on the same specifications. An average of the measured values is used as an estimated value for a transmitter having the same specifications. However, actually dispersion due to difference between individual transmitters exists, so that appropriate balance can not always be established.

SUMMARY OF THE INVENTION

It is an object of the present invention to always enable obtaining an appropriate balance in a demodulation circuit or a modulation circuit by absorbing drift due to such causes as temperature change or power fluctuation and also to always enable obtaining an appropriate balance in a demodulation circuit or a modulation circuit by absorbing dispersion due to differences between individual machines.

A DC offset circuit for a Cartesian loop according to the present invention supplies a first digital signal corresponding to a slope voltage from a minimum DC output voltage up to a maximum DC output voltage, step by step, to a D/A convertor in a state where a slope voltage supply circuit is inhibited by a modulated wave transmission inhibiting circuit to transmit a modulated wave from a second amplifier and only a carrier wave from a local oscillator is modulated and outputted from a demodulation circuit. Then, when it is detected by a detecting circuit that output from a first amplifier has reached a specified value, an offset voltage deciding circuit decides a value of the first digital signal corresponding to a slope voltage in the slope voltage supply circuit at a time when the specified value is detected as a DC offset voltage value. For this reason, drift due to such a cause as temperature change or power fluctuation is absorbed by starting operations centering on the DC voltage value.

A DC offset circuit for a Cartesian loop according to the present invention supplies a first digital signal corresponding to a slope voltage from a minimum DC output voltage up to a maximum DC output voltage, step by step, to a D/A convertor in a state where a slope voltage supply circuit is inhibited by a modulated wave transmission inhibiting circuit to transmit a modulated wave from a second amplifier and only a carrier wave from a local oscillator is modulated and outputted from a demodulation circuit. Then, when it is detected by a detecting circuit that output from a first amplifier has reached a specified value, an offset voltage deciding circuit decides a value obtained by subtracting a delay correction value previously set taking into considerations a delay time in a first amplifier from a value of the first digital value corresponding to a slope voltage in a slope voltage supply circuit at a time when the specified value is detected. For this reason, drift due to such a cause as temperature change or power fluctuation is absorbed by started operations centering on the DC offset voltage value.

A DC offset circuit for a Cartesian loop according to the present invention supplies a first digital signal corresponding to a slope voltage from a minimum DC output voltage to a minimum DC output voltage, step by step, to a DC convertor in a state where a slope voltage supply circuit is inhibited by a modulated wave transmission inhibiting circuit to transmit a modulated wave from a second amplifier. Only a carrier wave from a local oscillator is modulated and outputted by a demodulation circuit, each time transmission is started, after a capacitor is electrically separated from an amplifier by a switching circuit and resistors positioned in parallel amplifiers. Then, when it is detected by a detecting circuit that output from a first amplifier has reached a specified value, an offset voltage deciding circuit decides a value of the first digital signal corresponding to a slope voltage in the slope voltage supply circuit at a time when the specified value is detected as a DC offset voltage value. For this reason, drift due to such a cause as temperature change or power fluctuation is absorbed by started operations centering on the DC offset voltage value.

Other objects and features of this invention will become understood from the following description with reference to the accompanying drawings.

DESCRIPTION OF THE PREFERRED EMBODIMENTS

A detailed description is made hereinafter for a CARTESIAN loop DC offset circuit according to the present invention in the order of Embodiment 1, Embodiment 2, and Embodiment 3 with reference to the related drawings.

Figure 1:
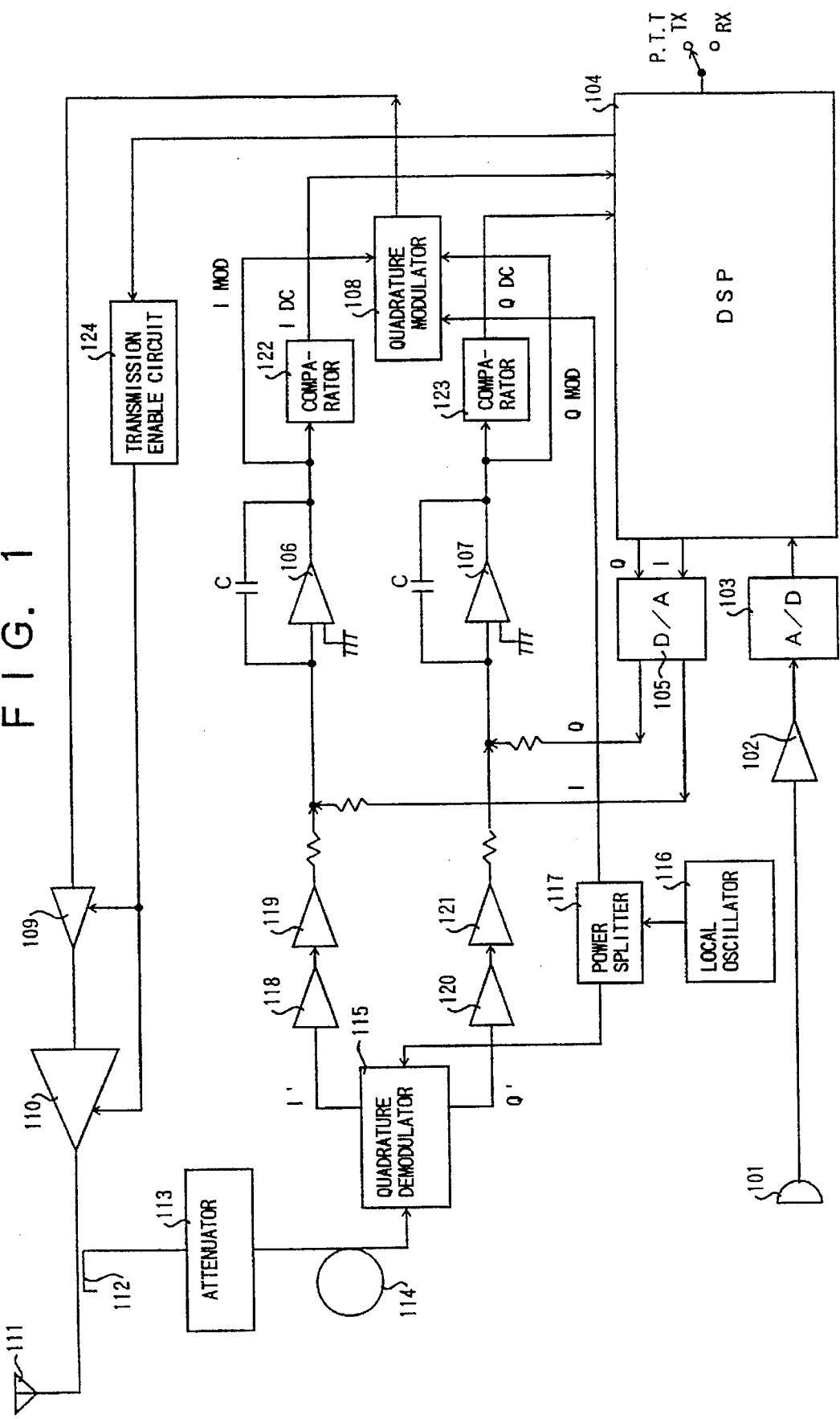
FIG. 1 is a block diagram of a tone-in-band transmitter with a distortion reducing circuit based on a direct modulation system in which DC offset circuit for Cartesian loop according to Embodiment 1 is applied.

FIG. 1 is a block diagram of a tone-in-band transmitter with a distortion reducing circuit based on a direction modulation system in which the DC offset circuit for Cartesian loop according to Embodiment 1 is applied. In this figure, an aural signal introduced from a microphone 101 is amplified in a microphone amplifier 102, subjected to A/D conversion in an A/D convertor 103, and then supplied to the DSP (speed processing circuit for modulation) 104.

In the DSP 104, an input aural signal is subjected to such a processing required for generation of tone-in-band as band limitation, band division, and frequency shift, and the signal is divided to two signals I, Q crossing each other at 90 degrees, said two signals I, Q being provided as output. These two signals I, Q are subjected to D/A conversion in a D/A convertor 105, and sent to input sections of in operational amplifiers 106, 107 provided correspondence to the signals I, Q. It should be noted that signals I', Q' demodulated by a quadrature demodulator 115 and amplified in amplifiers 118, 119 or amplifiers 120, 121 are inputted to the input sections of the operational amplifiers 106, 107, and subtraction (NFB) between signals I, Q and signals I', Q' is executed.

Then, a modulated wave (tone-in-band) is outputted from a quadrature modulator 108 by driving the quadrature modulator 108 with modulated output from the operational amplifiers 106, 107. It should be noted that a signal (carrier wave) from a local oscillator 116 is distributed and injected into the quadrature modulator 108.

The modulated wave outputted from the quadrature modulator 108 is amplified by a pre-amplifier 109 and an RF power amplifier 110, and then sent from an antenna 111. Also, only a progressive wave is detected by a directional coupler 112 from transmission power amplified by the RF power amplifier 110, and the progressive wave passes through an attenuator 113 and a phase line 114 each for level adjustment and is sent to a quadrature demodulator 115. It should be noted that a signal (carrier wave) from the local oscillator 116 is distributed and injected by the power splitter 117 into the quadrature demodulator 115 as in the case of the quadrature modulator 108.

The quadrature relationship of each signal is very important in the quadrature demodulator 115, and the aforesaid directional coupler 112 is employed to prevent effects by a reflected wave, and furthermore the phase line 114 is provided to accurately align a phase.

Thus, demodulated signals I', Q' appear in the output from the quadrature demodulator 115. The signals I', Q' are amplified by the amplifiers 118, 119 or the amplifiers 120, 121 in the next stage respectively, and are subjected to subtraction in input sections of the operational amplifiers 106, 107 each for modulation. Thus the distortion reducing circuit is operated.

In the figure, the reference numerals 122 and 123 indicate a comparator which detects outputs from the operational amplifiers 106, 107 each for modulation and outputs a signal when the output voltage is a specified value (0 V herein) respectively. Also, the reference numeral 124 indicates a transmission enable circuit as a modulated wave transmission inhibiting circuit which inhibits transmission of a modulated wave for transmission to the directional coupler 112 by disabling functions of the pre-amplifier 109 and the RF power amplifier 110.

Also, as shown in the figure, a capacitor C to make the loop run stably is inserted between the operational amplifiers 106, 107, each for modulation, and thus a differential input type of integration circuit is formed.

With the configuration described above, next a description is made for operations for measurement of a DC offset voltage value in Embodiment 1. At first, when power is turned ON and transmission is started, the DPS 104 sends a transmission inhibit signal to the transmission enable circuit 124. With this operation, the transmission enable circuit 124 disables the pre-amplifier 109 and the RF power amplifier 110, so that only a carrier wave from the local oscillator 116 is inputted into the quadrature demodulator 115, and only DC elements due to imbalance in the quadrature demodulator 115 are outputted as signals I', Q'. Then, a voltage of the signals I', Q' is in a range from several mV to several tens mV, but the signals are amplified by the amplifiers 118, 119 or the amplifiers 120, 121 in the next stage up to an around 100 times higher level, so that output from the operational amplifiers 106, 107 each for modulation is saturated.

Figure 2A:
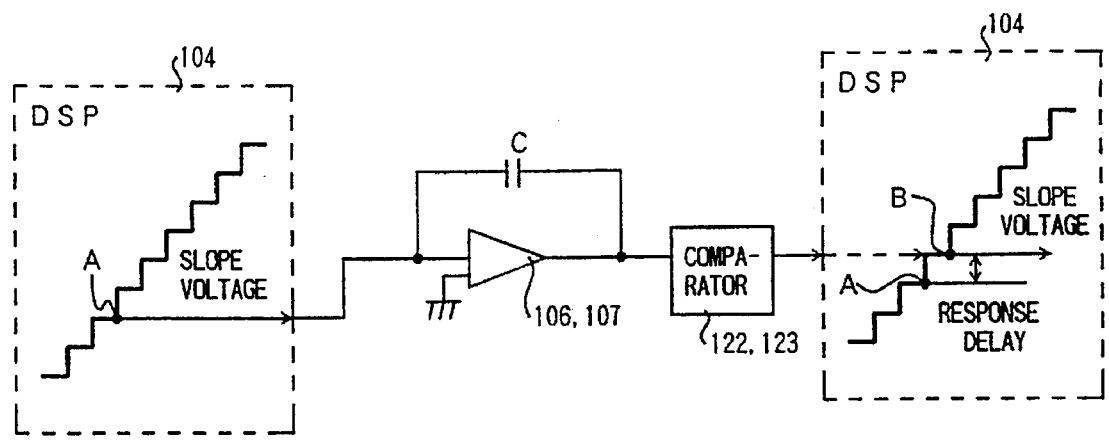
FIG. 2A is a drawing for explaining a slope voltage supplied from the DSP in Embodiment 1.

In this step, the DSP 104 outputs a slope voltage (staircase) from a minimum DC output voltage up to a maximum DC output voltage as a modulated output of signals I, Q as shown in FIG. 2A. The output slope voltages (two signals I, Q) are subjected to D/A conversion in the D/A convertor 105, and sent to input sections of the operational amplifiers 106, 107, each for modulation, provided in correspondence to the signals I, Q respectively. To the input sections of the operational amplifiers 106, 107, each for modulation, are inputted only DC elements due to imbalance in the quadrature demodulator 115 as signals I', Q' after being amplified in the amplifiers 118, 119 or the amplifiers 120, 121, and subtraction between the signals I, Q and signals I', Q' is executed in the input sections.

Because of this configuration, instantly when DC elements due to imbalance in the quadrature demodulator 115 are canceled by a slope voltage from the DSP 104, output from the operational amplifiers 106, 107, each for modulation, must pass through an output zone of 0 V. Then the comparator 122 or the comparator 123 reacts and sends a 0 detection signal to the DSP 104, so that the DSP 104 can detect a DC voltage value which balances the quadrature demodulator 115 (a slope voltage value then), and the DSP 104 recognizes and decides this slope voltage value as a DC offset value and starts operation centering on this DC offset voltage value.

As described above, the capacitor C is provided between the operational amplifiers 106, 107, each for modulation, and there occurs a slight response delay in the circuit. For this reason the slope voltage value actually outputted from the DSP 104 (Slope voltage value B in FIG. 2A) is fast by a value corresponding to the response delay above at a time when the slope voltage value outputted from the DSP 104 (Slope voltage value A in FIG. 2A) cancels DC elements due to imbalance in the quadrature demodulator 115, and the comparator 122 or the comparator 123 reacts and sends a 0 V detection signal to the DSP 104, but in Embodiment 1, a DC offset value for the operational amplifiers 106, 107, each for modulation, is measured each time, so that more stable balance for the quadrature demodulator 115 can be achieved as compared to the conventional technology.

Then, when the transmission enable circuit 124 is enabled for transmission, as this circuit is an NFB circuit, DC elements due to imbalance generated in the quadrature modulator 108 appear in the signals I', Q' outputted from the quadrature demodulator 115, and are amplified in the amplifiers 118, 119 or the amplifiers 120, 121, and then returned, automatic level adjustment being thereby executed.

Thus the DSP 104 can obtain an excellent operating point (DC offset voltage value). Also balance in each QAM (quadrature modulator 108 and quadrature demodulator 115) drifts due to such a cause as temperature change, but measurement of the DC offset voltage offset value is executed each time transmission is started, so that good balance can be obtained in each QAM.

In Embodiment 1, as described above, a slope voltage from a minimum DC output voltage up to a maximum DC output voltage is supplied to input sections of the operational amplifiers 106, 107, each for modulation, step by step. A value of the slope voltage at the point of time when the output is 0 V is decided as a DC offset voltage value, and operation is started centering on the DC offset voltage value. Hence, drift due to such a cause as temperature change or power fluctuation can be absorbed and an appropriate balance for the quadrature demodulator can always be obtained. In addition, dispersion due to differences between individual transmitters can be absorbed and appropriate balance for the quadrature demodulator well as for the quadrature modulator can always obtained.

The second embodiment has the substantially same structure as that of Embodiment 1, but an error of a slope voltage value corresponding to a response delay generated due to response delay in capacitors C in the operational amplifiers 106, 107 respectively is corrected by the DSP 104 so that a more accurate offset value will be obtained.

In Embodiment 2, the DSP 104 outputs a slope (staircase) voltage from a minimum DC output voltage to a maximum DC output voltage as shown in FIG. 2A as modulated output of signals I, Q. The output slope voltages (two signals I, Q) are subjected to D/A conversion in the D/A convertor 105 and are sent to input sections of the operational amplifiers 106, 107, each for modulation, provided in correspondence to the signals I, Q respectively. To the input sections of the operational amplifiers 106, 107, each for modulation, are being inputted only DC elements due to imbalance in the quadrature demodulator 115 amplified by the amplifiers 118, 119 or the amplifiers 120, 121 as signals I', Q', and subtraction between the signals I, Q and signals I', Q' is executed in the input sections.

With this operation, instantly when the DC elements due to imbalance in the quadrature demodulator 115 are canceled with the slope voltages from the DSP 104, output from the operational amplifiers 106, 107, each for modulation, must pass through 0 V. In this step, the comparator 122 or the comparator 123 reacts and sends a 0 V detection signal to the DSP 104, so that the DSP 104 can detect a DC voltage value (a slope voltage value then), balancing the quadrature demodulator 115.

As there is a slight response delay due to effects by a capacitor C provided between input and output terminals of the operational amplifiers 106, 107, each for modulation, in the circuit, in the state where the slope voltage (voltage value A in FIG. 2A) outputted from the DSP 104 cancels the DC elements due to imbalance in the quadrature demodulator 115, and the comparator 122 or the comparator 123 reacts and sends a 0 V detection signal to the DSP 104, the slope voltage value (slope voltage value B in FIG. 2A) actually being outputted from the DSP 104 is fast by a value corresponding to the response delay.

Figure 2B:
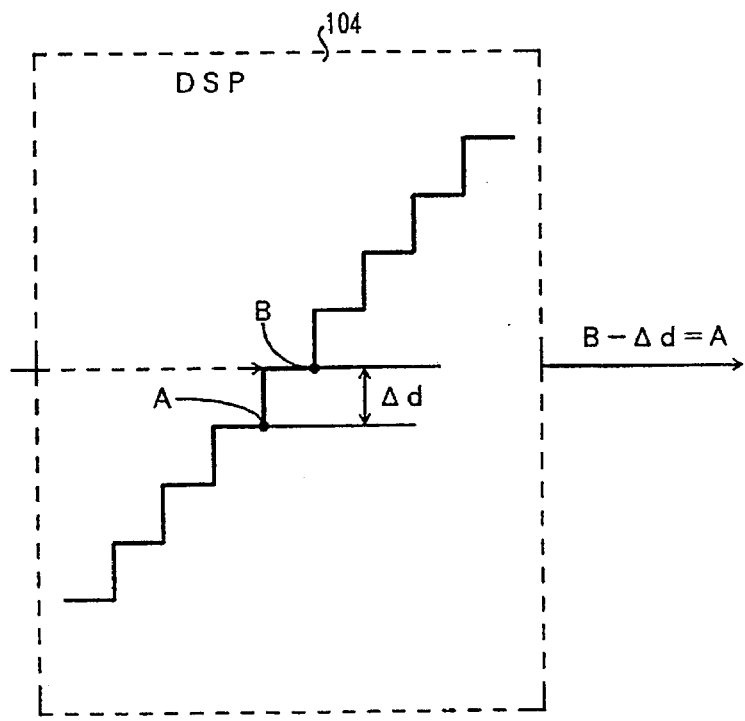
FIG. 2B is a drawing for explaining correction of a slope voltage in Embodiment 2.

For this reason, as shown in FIG. 2B, the DSP 104 makes a correction (subtraction) of the slope voltage value B by a voltage value Δd corresponding to the response delay, and decides the value of A obtained by subtracting Δd from the voltage value B (B −Δd=A) as a DC offset value.

In Embodiment 2, in addition to the effects obtained in Embodiment 1, correction is executed by using the voltage value Δd corresponding to the response delay in the circuit, so that a furthermore accurate DC offset value can be measured and a proper balance for the quadrature demodulator 115 can always be obtained.

Figure 3:
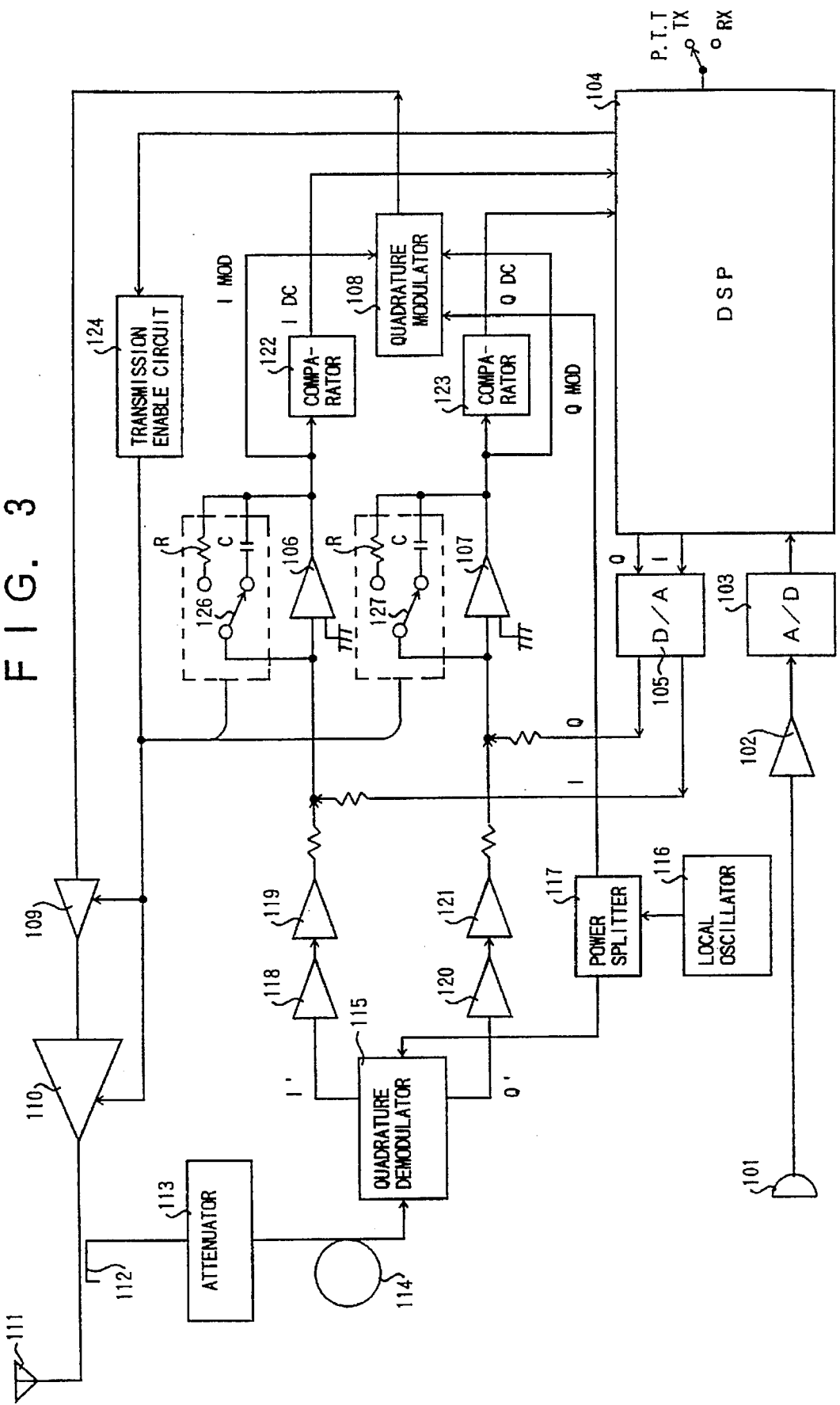
FIG. 3 is a block diagram of a tone-in-band transmitter with a distortion reducing circuit based on a direct modulation system in which the Cartesian loop DC circuit according to Embodiment 3 is applied.
Figure 4:
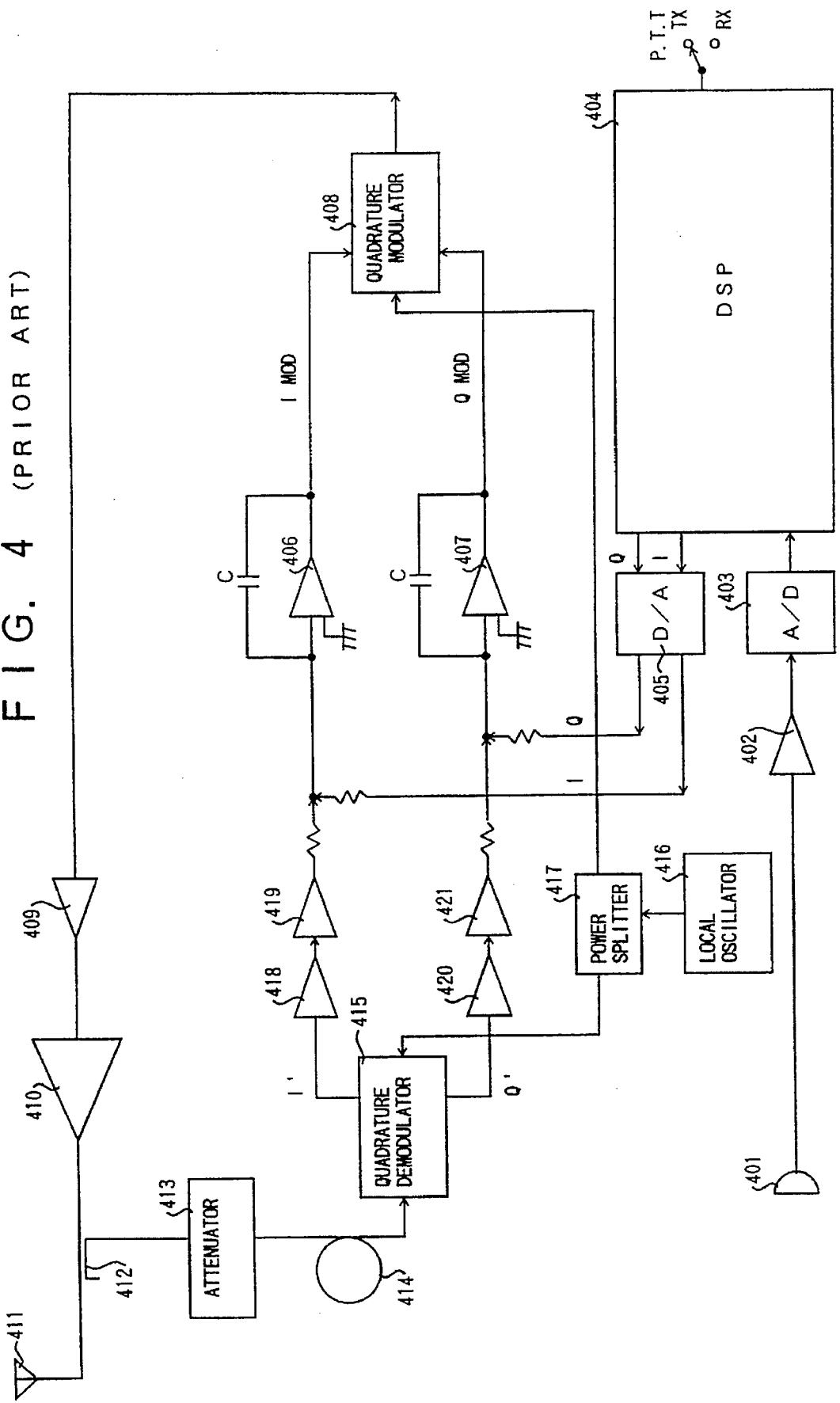
FIG. 4 is a block diagram of a key section of a conventional type of tone-in-band transmitter with a distortion reducing circuit based on a direct modulation system.

FIG. 3 is a block diagram of a tone-in-band transmitter with a distortion reducing circuit based on the direct modulation system in which the Cartesian loop DC offset value according to Embodiment 3 of the present invention is applied, and as shown in this figure, in addition to the structure in Embodiment 1, resistors R provided in parallel to the capacitor C in the operational amplifiers 106, 107, each for modulation, and switching circuits 126, 127, each electrically disconnecting the capacitors C from the operational amplifiers 106, 107, each for modulation, and electrically connecting the resistors R to the operational amplifiers 106, 107 each for modulation are provided.

By the way, in Embodiments 1 and 2, measurement of a DC offset value is executed each time transmission is started, so that it is necessary to finish the operation for DC offset value measurement as soon as possible. However, as the capacitors C for causing the loop to stably run are inserted between input and output terminals of the operational amplifiers 106, 107, each for modulation, response is delayed, and the operation can not be executed quickly. For this reason, in Embodiments 1 and 2, a slope voltage is loaded at a speed allowing response of the capacitors C. Also in Embodiment 2, the response delay is corrected by using an appropriate correction value (voltage value Δd) to furthermore improve the precision.

In Embodiment 3, during measurement of a DC offset value by the switching circuits 126, 127, the capacitors C for preventing oscillation of loops in the operational amplifiers 106, 107, each for modulation, are electrically disconnected, and the circuits are connected via the resistor R for switching to amplifiers, each having a proper DC gain. It should be noted that the operation by the switching circuits 126, 127 to switch the capacitors C and resistors R is executed in correlation to operations of the transmission enable circuit 124.

With the structure as described above, next description is made for operations. At first, when power is turned ON, the DSP 104 sends a transmission inhibit signal to the transmission enable circuit 124. Also, a switch signal is sent to the switching circuits 126, 127 in correlation to the transmission inhibit signal. With this operation, the transmission enable circuit 124 disables functions of the pre-amplifier 109 and the RF power amplifier 110, so that only a carrier wave from the local oscillator 116 is inputted to the quadrature demodulator 115 and only DC elements due to imbalance in the quadrature demodulator 115 are outputted as the signals I', Q'. Also, when a switch signal is inputted, the switching circuits 126, 127 switch the circuit connection from the capacitors C to the resistors R.

Namely, while transmission is inhibited, the operational amplifiers 106, 107, each for modulation, function as a DC amplifier via the resistor R respectively, and the response delay is reduced to that specific to each operational amplifier. Also, while transmission is inhibited, the loop is open, so that oscillation does not occur.

Then, the DSP 104 outputs, as in Embodiment 1, a slope voltage from a minimum DC output voltage to a maximum DC output voltage as a modulated output of the signals I, Q. The output slope voltages (two signals I, Q) are subjected to D/A conversion in the D/A convertor 105, and sent to input sections of the operational amplifiers 106, 107, each for modulation, provided in correspondence to the signals I, Q respectively. To the input sections of the operational amplifiers 106, 107, each for modulation, are being inputted only DC elements due to imbalance in the quadrature 115 as the signals I', Q' after being amplified by the amplifiers 118, 119 or the amplifiers 120, 121, and subtraction between the signals I, Q and signals I', Q' is executed in the input sections.

With this operation, instantly when DC elements due to imbalance in the quadrature demodulator 115 are canceled by a slope voltage from the DSP 104, outputs from the operational amplifiers 106, 107, each for modulation, must pass through 0 V. Then the comparator 122 or the comparator 123 reacts and sends a 0 V detection signal to the DSP 104, the DSP 104 can detect a DC voltage value allowing compulsory balance to the quadrature demodulator 115 (a slope voltage value then), and the DSP 104 recognizes and decides this slope voltage value as a DC offset value. Operation is thus started centering on the DC offset value.

The DSP 104 can obtain an excellent operating point (DC offset voltage value). Also, balance for each QAM (quadrature modulator 108 and quadrature demodulator 115) drifts due to such a reason as temperature change, but the operation for measurement of the DC offset value is executed at a high precision as well as a high speed each time transmission is started, so that good balance can be obtained.

As described above, in Embodiment 3, in addition to effects in Embodiment 1, while a DC offset value is being measured by the switching circuits 126, 127, the capacitors C for prevention of oscillation in the operational amplifiers 106, 107, each for modulation, are electrically disconnected, circuits are connected via the resistors R for switching to amplifiers each having a proper DC gain, a slope voltage from the minimum DC output voltage up to a maximum DC output voltage are supplied, step by step, to input sections of the operational amplifiers 106, 107, each for modulation, and a value of voltage at a time when the output is 0 V is decided as a DC offset value. Hence, high speed and high precision DC offset value measurement can be executed.

As described above, in the DC offset circuit for Cartesian loop according to the present invention, in the state where the slope voltage supply circuit is inhibited by the modulated wave transmission inhibiting circuit to transmit a modulated wave from the second modulating circuit, and only a carrier wave from the local oscillating circuit is demodulated and outputted from the demodulating circuit, a first digital signal corresponding to a slope voltage value from a minimum DC output voltage up to a maximum DC output voltage is supplied, step by step, to the D/A convertor, and when the detecting circuit detects that output from the first amplifier has reached a specified value, the offset voltage deciding circuit decides a value of the first digital signal corresponding to a slope voltage in the slope voltage supply circuit when the specified value is detected as a DC offset voltage value. Drift due to such a case as temperature change or power fluctuation is absorbed each time transmission is started, and a proper balance for the demodulation circuit can always be obtained. Also dispersion due to differences between individual transmitters is absorbed and proper balance for the demodulation circuit and the modulation circuit can be obtained.

Also in the DC offset circuit for a Cartesian loop according to the present invention, in the state where the slope voltage supply circuit is inhibited by the modulated wave transmission inhibiting circuit to transmit a modulated wave from the second amplifier and only a carrier wave from the local oscillator is outputted from the demodulation circuit, a first digital signal corresponding to a slope voltage from a minimum DC output voltage up to a maximum DC output voltage is supplied, step by step, to the D/A convertor. When the detecting circuit detects that output from the first amplifier has reached a specified value, the offset voltage deciding circuit decides a value obtained by subtracting a delay correction value, previously set up, taking into considerations a delay time in the first amplifier from a value of the first digital value corresponding to a slope voltage in the slope voltage supply circuit at a time when the specified value is detected. Hence, a DC offset voltage value can be measured at a high precision, and also drift due to such a cause as temperature change or power fluctuation is absorbed and a proper balance for the demodulation circuit can always be obtained. Also drift due to difference between individual transmitters is absorbed and a proper balance for the demodulation circuit and modulation circuit can be obtained.

In the DC offset circuit for a Cartesian loop according to the present invention, each time transmission is started, after the capacitors are electrically disconnected from the amplifiers by the switching circuit and resistors positioned in parallel to the capacitors are electrically connected to the amplifiers, the following occurs. In the state where the slope voltage supply circuit is inhibited by the modulated wave transmission inhibiting circuit to transmit a modulated wave from the second amplifier and only a carrier wave from the local oscillator is demodulated and outputted from the demodulation circuit, a first digital signal corresponding to a slope voltage from a minimum DC output voltage up to a maximum DC output voltage is supplied step by step to the D/A convertor. Then when the detecting circuit detects that output from the first amplifier has reached the specified value, the offset voltage deciding circuit decides a value of the first digital signal corresponding to a slope voltage in the slope voltage supply circuit when the specified value is detected as a DC offset voltage value. Hence, high speed and high precision DC offset value measurement can be executed, and also drift due to such a cause as temperature change or power fluctuation is absorbed, and a proper balance for the demodulation circuit can be obtained. Also dispersion due to difference between individual transmitters is absorbed, and a proper balance for the demodulation circuit and the modulation circuit can always be obtained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. DC offset circuit for a Cartesian loop in a tone-in-band transmitter with a distortion reducing circuit based on a direct modulation system having a digital signal processor outputting a first digital signal based on data to be transmitted when transmission is started, a D/A convertor converting the first digital signal to a first analog signal, a first amplifier amplifying a signal obtained through subtraction between the first analog signal and a second analog signal and outputting the signal as a third analog signal, a modulation circuit modulating the third analog signal into a modulated wave, a second amplifier amplifying the modulated wave and supplying the wave to antenna, a demodulation circuit demodulating a portion of the amplified modulated wave according to an output from a local oscillator, and a supply circuit supplying an output from said demodulation circuit as the second analog signal to said first amplifier, said DC offset circuit for a Cartesian loop comprising:

a modulated wave transmission inhibiting circuit inhibiting transmission of a modulated wave from said second amplifier;

a slope voltage supply circuit supplying, step by step, a first digital signal corresponding to a slope voltage from a minimum DC output voltage up to a maximum DC output voltage to said D/A convertor in a state where transmission of a modulated wave from said second amplifier is inhibited and a carrier wave from said local oscillator is demodulated and outputted from said demodulation circuit;

a detecting circuit detecting that output from said first amplifier has reached a specified value; and an offset voltage deciding circuit deciding a value of the first digital value corresponding to a slope voltage in said slope voltage supply circuit at a time when a specified value is detected in said detecting circuit as being a DC offset voltage value.

2. DC offset circuit for a Cartesian loop in a tone-in-band transmitter with a distortion reducing circuit based on a direct modulation system having a digital signal processor outputting a first digital signal based on data to be transmitted when transmission is started, a D/A convertor converting said first digital signal to a first analog signal, a first amplifier amplifying a signal obtained through subtraction between the first analog signal and a second analog signal and outputting the signal as a third analog signal, a modulation circuit modulating the third analog signal into a modulated wave, a second amplifier amplifying the modulated wave and supplying the wave to an antenna, a demodulation circuit demodulating a portion of the amplified modulated wave according to an output from a local oscillator, and a supply circuit supplying output from said demodulation circuit as the second analog signal to said first amplifier, said DC offset circuit for a Cartesian loop comprising:

a modulated wave transmission inhibiting circuit inhibiting transmission of a modulated wave from said second amplifier;

a slope voltage supply circuit supplying, step by step, a first digital signal corresponding to a slope voltage from a minimum DC output voltage up to a maximum DC output voltage to said D/A convertor in a state where transmission of a modulated wave from said second amplifier is inhibited, and a carrier wave from said local oscillator is demodulated and outputted from said demodulation circuit;

a detecting circuit detecting that the output from said first amplifier has reached a specified value; and an offset voltage deciding circuit deciding a value obtained by subtracting a delay correction value, previously set taking into considerations a delay time in a first amplifier, from the first digital value corresponding to a slope voltage in said slope voltage supply circuit at a time when a specified value is detected in said detecting circuit as being a DC offset voltage value.

3. A DC offset circuit for a Cartesian loop in a tone-in-band transmitter with a distortion reducing circuit based on a direct modulation system having a digital signal processor outputting a first digital signal based on data to be transmitted when transmission is started, a D/A convertor converting the first digital signal to a first analog signal, a first amplifier amplifying a signal obtained through subtraction between the first analog signal and a second analog signal and outputting the signal as a third analog signal, a modulation circuit modulating the third analog signal into a modulated wave, a second amplifier amplifying the modulated wave and supplying the wave to an antenna, a demodulator demodulating a portion of the amplified modulated wave according to an output from a local oscillator, and a supply circuit supplying an output from said demodulation circuit as the second analog signal to said first amplifier, said DC offset circuit for a Cartesian loop comprising:

resistors together with integrating circuits each comprising an amplifier and a capacitor and positioned in parallel with each other, switching circuits electrically disconnecting said capacitors from said amplifiers and electrically connecting said resistors in parallel with said amplifiers, a modulated wave transmission inhibiting circuit inhibiting transmission of a modulated wave from said first amplifier, a slope voltage supply circuit supplying, step by step, a first digital signal corresponding to a slope voltage, from a minimum DC output voltage up to a maximum DC output voltage, to said D/A convertor in a state where transmission of a modulated wave from said first amplifier is inhibited and only a carrier wave from said local oscillator is demodulated and outputted from said demodulation circuit, a detecting circuit detecting that output from said first amplifier has reached a specified value, and an offset voltage deciding circuit deciding a value of the first digital signal corresponding to a slope voltage in said slope voltage supply circuit at a time when the specified value is detected in said detecting circuit.

4. A DC offset circuit for a Cartesian loop according to claim 3, wherein said first amplifier comprises integrating circuits each comprising an amplifier and a capacitor.

5. A radio transmitter comprising:

a digital signal processor responsive to a microphone for generating first and second input signals separated in phase by 90°, a local oscillator for generating a carrier wave signal, a quadrature modulator responsive to said first and second input signals and said carrier wave signal for generating a modulated signal, an antenna responsive to said modulated signal for radiating a transmitted signal, a quadrature demodulator responsive to said modulated signal and said carrier wave signal for generating a first and second demodulated signals, a first subtraction circuit responsive to said first input signal and said first demodulated signal for generating a first resultant signal indicative of a difference between said first input signal and said first demodulated signal, a second subtraction circuit responsive to said second input signal and said second demodulated signal for generating a second resultant signal indicative of a difference between said second input signal and said second demodulated signal, a first comparator responsive to said first resultant signal for generating a first feedback signal supplied to said digital signal processor to indicate a DC offset value of said first input signal when said first resultant signal is equal to a first reference value, and a second comparator responsive to said second resultant signal for generating a second feedback signal supplied to said digital signal processor to indicate a DC offset value of said second input signal when said second resultant signal is equal to a second reference value.

6. The radio transmitter of claim 5 further comprising a transmission enable circuit coupled to an output of said digital sign processor.

7. The radio transmitter of claim 6, wherein said digital signal processor controls said transmission enable circuit to prevent transmission of said modulated signal.

8. The radio transmitter of claim 7, wherein said digital signal processor controls said transmission enable circuit to prevent transmission of said modulated signal to measure the DC offset values each time when an electrical power is supplied to said radio transmitter.

* * * * *